(12) United States Patent  
Kim

(10) Patent No.: US 11,336,282 B2  
(45) Date of Patent: May 17, 2022

(54) DEVICES CONFIGURED TO CONDUCT A POWER GATING OPERATION

(71) Applicant: SK hynix Inc., Icheon-si (KR)

(72) Inventor: Woongrae Kim, Icheon-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 17/195,292

(22) Filed: Mar. 8, 2021

(65) Prior Publication Data

US 2022/0094362 A1    Mar. 24, 2022

(30) Foreign Application Priority Data

Sep. 24, 2020 (KR) .................. 10-2020-0123526

(51) Int. Cl.
*H03K 19/00* (2006.01)
*H03K 17/14* (2006.01)
*G06F 1/10* (2006.01)
*G06F 1/3237* (2019.01)

(52) U.S. Cl.
CPC .......... *H03K 19/0016* (2013.01); *G06F 1/10* (2013.01); *G06F 1/3237* (2013.01); *H03K 17/145* (2013.01)

(58) Field of Classification Search
CPC .... H03K 19/0016; H03K 17/145; G06F 1/10; G06F 1/3237

USPC ........................................................ 327/544
See application file for complete search history.

(56) References Cited

U.S. PATENT DOCUMENTS

2004/0027902 A1* 2/2004 Ooishi .............. G11C 11/40622  
365/222

FOREIGN PATENT DOCUMENTS

KR       101914296 B1    11/2018

* cited by examiner

*Primary Examiner* — Tomi Skibinski  
(74) *Attorney, Agent, or Firm* — William Park & Associates Ltd.

(57) ABSTRACT

A device includes a power gating signal generation circuit, a clock interrupt signal generation circuit, and a shift clock generation circuit. The power gating signal generation circuit configured to generate a power gating signal based on a mode entry signal and a mode exit signal to perform a power gating operation. The clock interrupt signal generation circuit configured to generate a clock interrupt signal based on the mode entry signal and the power gating signal to perform a clock interrupt operation. The shift clock generation circuit configured to generate a shift clock signal supplied to an internal circuit based on the power gating signal and the clock interrupt signal.

27 Claims, 19 Drawing Sheets

DEVICES CONFIGURED TO CONDUCT A POWER GATING OPERATION

CROSS-REFERENCE TO RELATED APPLICATIONS

The present application claims priority under 35 U.S.C 119(a) to Korean Application No. 10-2020-0123526, filed on Sep. 24, 2020, which is incorporated herein by reference in its entirety.

BACKGROUND

1. Technical Field

Embodiments of the present disclosure relate to devices that are configured to perform a power gating operation.

2. Related Art

Semiconductor devices may receive commands to perform various internal operations including an active operation, a write operation, a read operation, and a pre-charge operation. Recently, semiconductor devices applied to mobile systems have provided a power-down mode for stopping generation of clock signals necessary for the internal operations to reduce power consumption. In the power-down mode, a power gating operation may be performed to control a power source voltage supplied to internal circuits included in the semiconductor devices.

SUMMARY

According to an embodiment, a device may include a power gating signal generation circuit, a clock interrupt signal generation circuit, and a shift clock generation circuit. The power gating signal generation circuit may be configured to generate a power gating signal based on a mode entry signal and a mode exit signal to perform a power gating operation. The clock interrupt signal generation circuit may be configured to generate a clock interrupt signal based on the mode entry signal and the power gating signal to perform a clock interrupt operation. The shift clock generation circuit may be configured to generate a shift clock signal supplied to an internal circuit based on the power gating signal and the clock interrupt signal.

According to another embodiment, a device may include a power gating signal generation circuit, a clock interrupt signal generation circuit, and a shift clock generation circuit. The power gating signal generation circuit may be configured to generate a power gating signal activated to perform a power gating operation based on a point in time when a mode entry signal is activated. In addition, the power gating signal generation circuit may be configured to generate the power gating signal deactivated to terminate the power gating operation based on a point in time when a mode exit signal is activated. The clock interrupt signal generation circuit may be configured to generate a clock interrupt signal that is activated for execution of a clock interrupt operation during a period which is set to be greater than a period during which the power gating signal is activated. The shift clock generation circuit may be configured to generate a shift clock signal supplied to an internal circuit based on the power gating signal and the clock interrupt signal.

According to another embodiment, a device may include a power gating signal generation circuit, a clock interrupt signal generation circuit, a shift clock generation circuit, and an internal circuit. The power gating signal generation circuit may be configured to generate a power gating signal to perform a power gating operation. The clock interrupt signal generation circuit may be configured to generate a clock interrupt signal that is activated for execution of a clock interrupt operation during a period which is set to be greater than a period during which the power gating signal is activated. The shift clock generation circuit may be configured to stop generating a shift clock signal by interrupting supply of a power gating voltage, which is generated from a power source voltage, when the power gating operation is performed. In addition, the shift clock generation circuit may be configured to stop generating the shift clock signal when the clock interrupt operation is performed. The internal circuit may be configured to generate an output signal by shifting an input signal based on the shift clock signal while the internal circuit is out of a power-down mode.

DETAILED DESCRIPTION

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure, or vice versa.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment, or vice versa.

Various embodiments of the present disclosure will be described hereinafter with reference to the accompanying drawings. However, the embodiments described herein are for illustrative purposes only and are not intended to limit the scope of the present disclosure.

Figure 1:
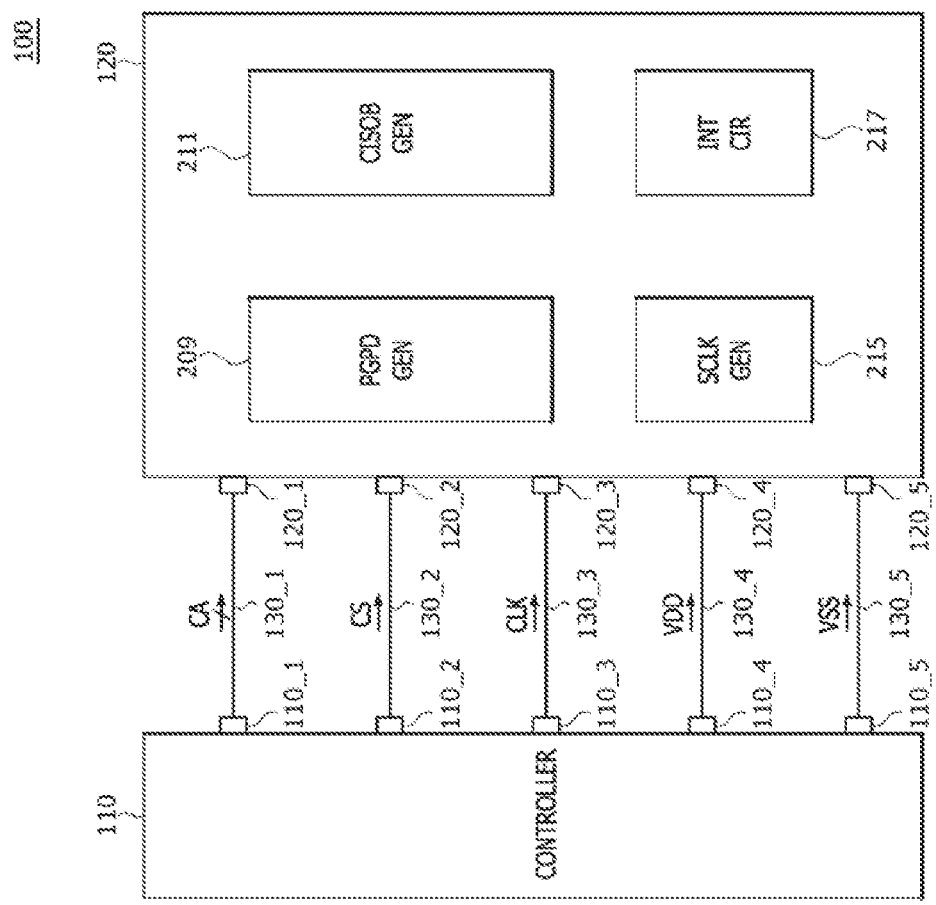
FIG. 1 is a block diagram illustrating a configuration of a system according to an embodiment of the present disclosure.

FIG. 1 is a block diagram illustrating a configuration of a system 100 according to an embodiment of the present disclosure. As illustrated in FIG. 1, the system 100 may include a controller 110 and a device 120. The controller 110 may include a first control pin 110_1, a second control pin 110_2, a third control pin 110_3, a fourth control pin 110_4, and a fifth control pin 1105. The device 120 may include a first device pin 120_1, a second device pin 120_2, a third device pin 120_3, a fourth device pin 120_4, and a fifth device pin 120_5. The controller 110 may transmit a set signal CA to the device 120 through a first transmission line 130_1 connecting the first control pin 1101 to the first device pin 120_1. The set signal CA may include a command and an address. Each of the first control pin 1101 and the first device pin 120_1 may be realized using a plurality of pins according to the number of bits of the set signal CA. The controller 110 may transmit a chip selection signal CS to the device 120 through a second transmission line 130_2 connecting the second control pin 110_2 to the second device pin 120_2. The controller 110 may transmit a clock signal CLK to the device 120 through a third transmission line 130_3 connecting the third control pin 110_3 to the third device pin 120_3. The controller 110 may supply a power source voltage VDD to the device 120 through a fourth transmission line 130_4 connecting the fourth control pin 110_4 to the fourth device pin 120_4. The controller 110 may supply a ground voltage VSS to the device 120 through a fifth transmission line 130_5 connecting the fifth control pin 110_5 to the fifth device pin 120_5.

The device 120 may be realized using a semiconductor device. The device 120 may receive the set signal CA, the chip selection signal CS, the clock signal CLK, the power source voltage VDD, and the ground voltage VSS from the controller 110. The device 120 may perform a power gating operation to control the supply of at least one of the power source voltage VDD and the ground voltage VSS in a power-down mode. The device 120 may include a power gating signal generation circuit (PGPD GEN) 209 that generates a power gating signal (PGPD of FIG. 2) activated during a power gating period in which the power gating operation is performed. The device 120 may include a clock interrupt signal generation circuit (CISOB GEN) 211 that generates a clock interrupt signal CISOB activated during a clock interrupt period which is set to be greater than the power gating period. The device 120 may include a shift clock generation circuit (SCLK GEN) 215 that receives the power source voltage VDD and the ground voltage VSS to generate a shift clock signal (SCLK of FIG. 2) while the device is out of the power-down mode. The shift clock generation circuit 215 may stop receiving the power source voltage VDD to generate the shift clock signal SCLK during the power gating period. The shift clock generation circuit 215 may stop generating the shift clock signal SCLK during the clock interrupt period which is set to be greater than the power gating period. The device 120 may include an internal circuit (INT CTR) 127 that receives a power gating voltage (VDD_ST of FIG. 5) generated from the power source voltage VDD and the ground voltage VSS to perform various internal operations based on the shift clock signal SCLK while the device is out of the power-down mode. The internal operations performed by the internal circuit 217 may include a shift operation, a latch operation, and various operations of a semiconductor device. Each of MOS transistors included in the internal circuit 217 may selectively receive the power source voltage VDD or a first power gating voltage (VDD_ST of FIG. 6) generated from the power source voltage VDD during the power gating period and may also selectively receive the ground voltage VSS or a second power gating voltage (VSS_ST of FIG. 6) generated from the ground voltage VSS during the power gating period.

Figure 2:
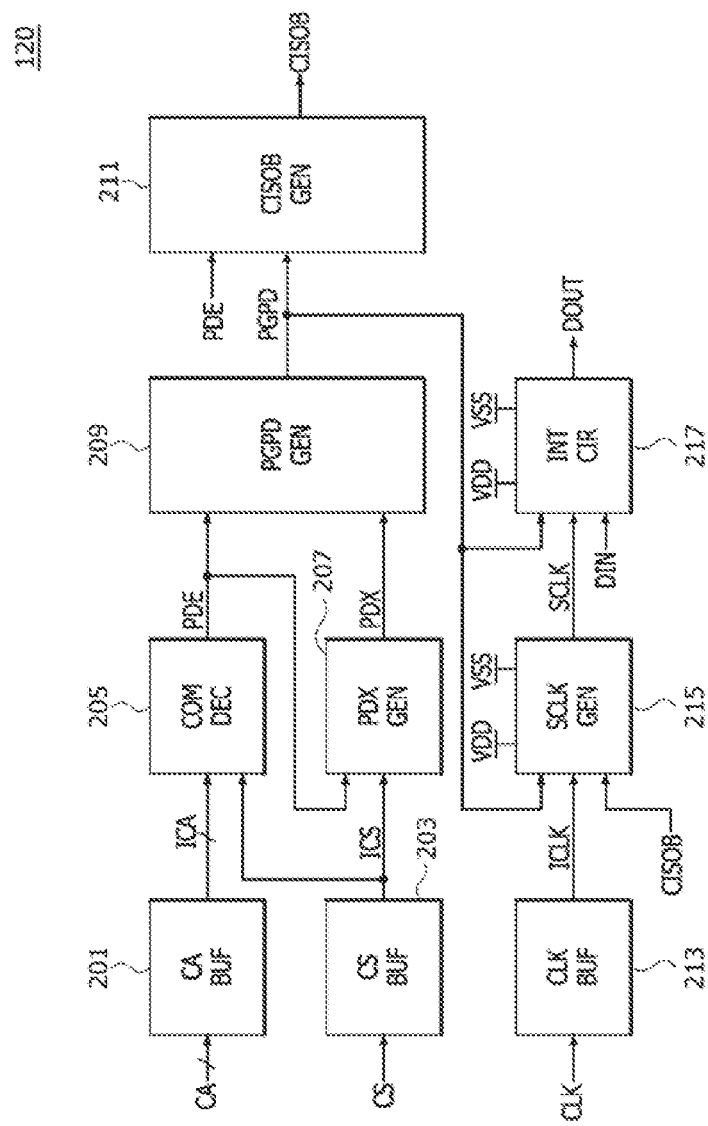
FIG. 2 is a block diagram illustrating a configuration of a device included in the system illustrated in FIG. 1.

FIG. 2 is a block diagram illustrating a configuration of the device 120. As illustrated in FIG. 2, the device 120 may include a set signal buffer circuit (CA BUF) 201, a chip selection signal buffer circuit (CS BUF) 203, a command decoder (COM DEC) 205, a mode exit signal generation circuit (PDX GEN) 207, the power gating signal generation circuit (PGPD GEN) 209, the clock interrupt signal generation circuit (CISOB GEN) 211, a clock buffer circuit (CLK BUF) 213, the shift clock generation circuit (SCLK GEN) 215, and the internal circuit (INT CTR) 217.

The set signal buffer circuit 201 may generate an internal set signal ICA based on the set signal CA. The number of bits of the set signal CA and the internal set signal ICA may be set to be different according to the embodiments. The set signal buffer circuit 201 may transmit the internal set signal ICA to the command decoder 205. The chip selection signal buffer circuit 203 may buffer the chip selection signal CS to generate an internal chip selection signal ICS. The chip selection signal buffer circuit 203 may transmit the internal chip selection signal ICS to the command decoder 205 and the mode exit signal generation circuit 207.

The command decoder 205 may receive the internal set signal ICA from the set signal buffer circuit 201 and may receive the internal chip selection signal ICS from the chip selection signal buffer circuit 203. The command decoder 205 may generate a mode entry signal PDE based on the internal chip selection signal ICS and the internal set signal ICA. The command decoder 205 may generate the mode entry signal PDE by decoding the internal set signal ICA based on the internal chip selection signal ICS. For example, the command decoder 205 may generate the mode entry signal PDE activated when the internal set signal ICA including bits having a predetermined logic level combination is input while the internal chip selection signal ICS is activated. A logic level of the internal chip selection signal ICS which is activated, a predetermined logic level combination of bits included in the internal set signal ICA, and a logic level of the mode entry signal PDE which is activated may be set to be different according to the embodiments.

The mode exit signal generation circuit 207 may receive the internal chip selection signal ICS from the chip selection signal buffer circuit 203 and may also receive the mode entry signal PDE from the command decoder 205. The mode exit signal generation circuit 207 may generate a mode exit signal PDX based on the mode entry signal PDE and the internal chip selection signal ICS. The mode exit signal generation circuit 207 may generate the mode exit signal PDX based on the internal chip selection signal ICS in the power-down mode. For example, when the internal chip selection signal ICS is activated after the mode entry signal PDE is activated to enter the power-down mode, the mode exit signal generation circuit 207 may generate the mode exit signal PDX activated to exit the power-down mode. A logic level of the mode exit signal PDX which is activated may be set to be different according to the embodiments.

The power gating signal generation circuit 209 may receive the mode entry signal PDE from the command decoder 205 and may also receive the mode exit signal PDX from the mode exit signal generation circuit 207. The power gating signal generation circuit 209 may generate the power gating signal PGPD based on the mode entry signal PDE and the mode exit signal PDX. The power gating signal generation circuit 209 may generate the power gating signal PGPD activated to perform the power gating operation when the mode entry signal PDE is activated to execute the power-down mode. The power gating signal generation circuit 209 may generate the power gating signal PGPD deactivated to terminate the power gating operation when the mode exit signal PDX is activated to terminate the power-down mode. The power gating signal PGPD may be activated during the power gating period that the power gating operation is performed.

The clock interrupt signal generation circuit 211 may receive the mode entry signal PDE from the command decoder 205 and may receive the power gating signal PGPD from the power gating signal generation circuit 209. The clock interrupt signal generation circuit 211 may generate the clock interrupt signal CISOB based on the mode entry signal PDE and the power gating signal PGPD. The clock interrupt signal generation circuit 211 may generate the clock interrupt signal CISOB activated to perform a clock interrupt operation when the mode entry signal PDE is activated to execute the power-down mode. The clock interrupt signal generation circuit 211 may generate the clock interrupt signal CISOB deactivated to terminate the clock interrupt operation when the power gating signal PGPD is deactivated by termination of the power gating operation. The clock interrupt signal CISOB may be activated during the clock interrupt period that the clock interrupt operation is performed. The clock interrupt period may be set to be greater than the power gating period.

The clock buffer circuit 213 may generate an internal clock signal ICLK based on the clock signal CLK. The clock buffer circuit 213 may buffer the clock signal CLK to generate the internal clock signal ICLK. In some embodiments, the clock buffer circuit 213 may divide the clock signal CLK to generate the internal clock signal ICLK.

The shift clock generation circuit 215 may receive the power gating signal PGPD from the power gating signal generation circuit 209, may receive the clock interrupt signal CISOB from the clock interrupt signal generation circuit 211, and may receive the internal clock signal ICLK from the clock buffer circuit 213. While the device is out of the power-down mode, the shift clock generation circuit 215 may receive the power gating voltage (VDD_ST of FIG. 5) generated from the power source voltage VDD and the ground voltage VSS and may delay the internal clock signal ICLK to generate the shift clock signal SCLK. The shift clock generation circuit 215 may stop receiving the power gating voltage VDD_ST generated from the power source voltage VDD to reduce the power consumption of the device and to prevent characteristics of the shift clock signal SCLK from being degraded during the power gating period that the power gating signal PGPD is activated. The shift clock generation circuit 215 may inhibit generation of the shift clock signal SCLK during the clock interrupt period in which the clock interrupt signal CISOB is activated.

The internal circuit 217 may receive the power gating signal PGPD from the power gating signal generation circuit 209 and may receive the shift clock signal SCLK from the shift clock generation circuit 215. While the device is out of the power-down mode, the internal circuit 217 may receive the power source voltage VDD and the ground voltage VSS and may shift an input signal DIN based on the shift clock signal SCLK to generate an output signal DOUT. During the power gating period in which the power gating signal PGPD is activated, the internal circuit 217 may selectively receive the power source voltage VDD or the first power gating voltage (VDD_ST of FIG. 6) generated from the power source voltage VDD or may selectively receive the ground voltage VSS or the second power gating voltage (VSS_ST of FIG. 6) generated from the ground voltage VSS. As a result, it may be possible to prevent nodes included in the internal circuit 217 from being electrically floated, and the nodes of the internal circuit 217 may be set to have predetermined logic levels according to the input signal DIN.

Figure 3:
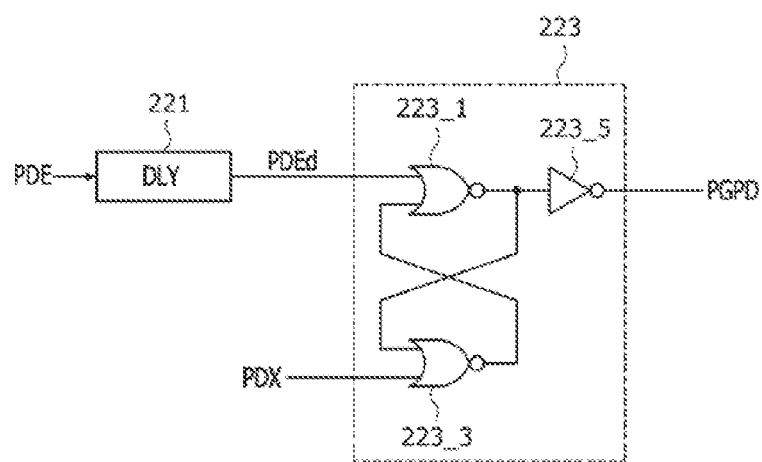
FIG. 3 illustrates a configuration of a power gating signal generation circuit included in the device illustrated in FIG. 2.

Referring to FIG. 3, the power gating signal generation circuit 209 may include a mode delay circuit 221 and a power gating signal latch circuit 223.

The mode delay circuit 221 may delay the mode entry signal PDE to generate a delayed mode entry signal PDEd. The power gating signal latch circuit 223 may receive the delayed mode entry signal PDEd generated by the mode delay circuit 221 and may receive the mode exit signal PDX from the mode exit signal generation circuit 207. The power gating signal latch circuit 223 may generate the power gating signal PGPD based on the delayed mode entry signal PDEd and the mode exit signal PDX. The power gating signal latch circuit 223 may include NOR gates 223_1 and 223_3 and an inverter 223_5. The NOR gate 223_1 may receive the delayed mode entry signal PDEd and an output signal of the NOR gate 223_3 to perform a logical NOR operation. The NOR gate 223_3 may receive the mode exit signal PDX and an output signal of the NOR gate 223_1 to perform a logical NOR operation. The inverter 2235 may inversely buffer the output signal of the NOR gate 223_1 to output the inversely buffered signal of the output signal of the NOR gate 223_1 as the power gating signal PGPD. The power gating signal latch circuit 223 may function as an SR latch circuit that receives the delayed mode entry signal PDEd acting as a set signal and the mode exit signal PDX acting as a reset signal to generate the power gating signal PGPD. The power gating signal latch circuit 223 may generate the power gating signal PGPD which is activated to have a logic "high" level in synchronization with a point in time when the delayed mode entry signal PDEd is activated to have a logic "high" level after a delay period determined by the mode delay circuit 221 elapses from a point in time when the mode entry signal PDE is activated to have a logic "high" level in the power-down mode. The power gating signal latch circuit 223 may generate the power gating signal PGPD which is deactivated to have a logic "low" level in synchronization with a point in time when the mode exit signal PDX is activated to a logic "high" level out of the power-down mode.

Figure 4:
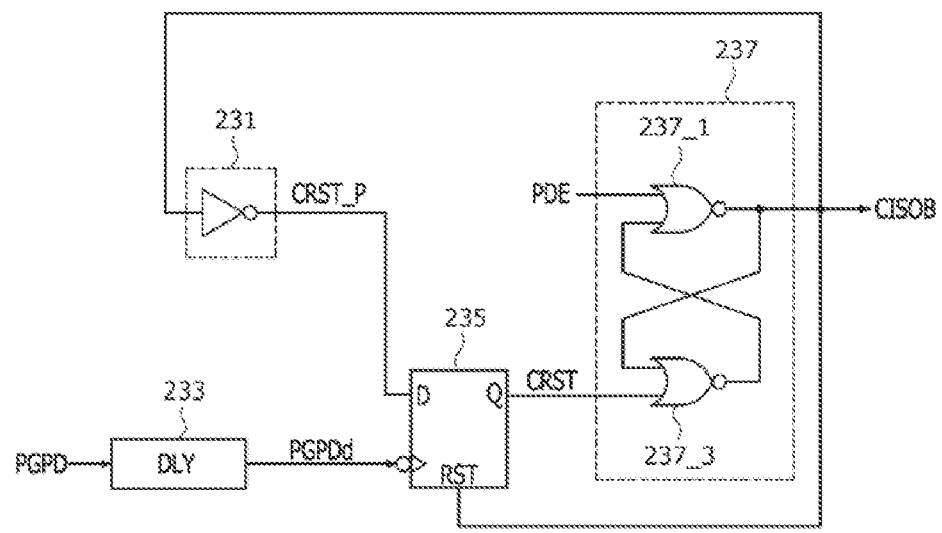
FIG. 4 is a diagram according to an example of a clock interrupt signal generation circuit included in the device illustrated in FIG. 2.

Referring to FIG. 4, the clock interrupt signal generation circuit 211 may include a pre-clock reset signal generation circuit 231, a power gating delay circuit 233, a clock reset signal generation circuit 235, and a clock interrupt signal latch circuit 237.

The pre-clock reset signal generation circuit 231 may receive the clock interrupt signal CISOB from the clock interrupt signal latch circuit 237. The pre-clock reset signal generation circuit 231 may generate a pre-clock reset signal CRST_P based on the clock interrupt signal CISOB. The pre-clock reset signal generation circuit 231 may be realized using an inverter and may inversely buffer the clock interrupt signal CISOB to generate the pre-clock reset signal CRST_P.

The power gating delay circuit 233 may receive the power gating signal PGPD from the power gating signal generation circuit 209. The power gating delay circuit 233 may delay the power gating signal PGPD to generate a delayed power gating signal PGPDd. A delay period determined by the power gating delay circuit 233 may be set to be different according to the embodiments.

The clock reset signal generation circuit 235 may receive the pre-clock reset signal CRST_P from the pre-clock reset signal generation circuit 231, may receive the delayed power gating signal PGPDd from the power gating delay circuit 233, and may receive the clock interrupt signal CISOB from the clock interrupt signal latch circuit 237. The clock reset signal generation circuit 235 may generate a clock reset signal CRST based on the pre-clock reset signal CRST_P, the delayed power gating signal PGPDd, and the clock interrupt signal CISOB. The clock reset signal generation circuit 235 may latch the pre-clock reset signal CRST_P to output the latched signal of the pre-clock reset signal CRST_P as the clock reset signal CRST when the power gating operation terminates and a level of the delayed power gating signal PGPDd generated by the power gating delay circuit 233 changes from a logic "high" level into a logic "low" level (hereinafter, referred to as a "failing edge"). The falling edge of the delayed power gating signal PGPDd may occur at a point in time when a delay period determined by the power gating delay circuit 233 elapses from a point in time when the falling edge of the power gating signal PGPD occurs by termination of the power gating operation. The clock reset signal generation circuit 235 may reset the clock reset signal CRST based on the clock interrupt signal CISOB. The clock reset signal generation circuit 235 may generate the clock reset signal CRST which is reset to have a logic "low" level when the clock interrupt signal CISOB is deactivated to have a logic "high" level. The clock reset signal generation circuit 235 may generate the clock interrupt signal CISOB which is deactivated to a logic "high" level when the clock reset signal CRST is generated to have a logic "high" level while the mode entry signal PDE is deactivated to have a logic "low" level.

The clock interrupt signal latch circuit 237 may receive the mode entry signal PDE from the command decoder 205 and may receive the clock reset signal CRST from the clock reset signal generation circuit 235. The clock interrupt signal latch circuit 237 may generate the clock interrupt signal CISOB based on the mode entry signal PDE and the clock reset signal CRST. The clock interrupt signal latch circuit 237 may include NOR gates 237_1 and 237_3. The NOR gate 237_1 may receive the mode entry signal PDE and an output signal of the NOR gate 237_3 and may perform a logical NOR operation of the mode entry signal PDE and the output signal of the NOR gate 237_3 to output the result of the logical NOR operation as the clock interrupt signal CISOB. The NOR gate 237_3 may receive the clock reset signal CRST and an output signal of the NOR gate 237_1 to perform a logical NOR operation of the clock reset signal CRST and the output signal of the NOR gate 237_1. The clock interrupt signal latch circuit 237 may function as an SR latch circuit that receives the mode entry signal PDE acting as a set signal and the clock reset signal CRST acting as a reset signal to generates the clock interrupt signal CISOB. The clock interrupt signal latch circuit 237 may activate the clock interrupt signal CISOB to a logic "low" level in synchronization with a point in time when the mode entry signal PDE is activated to a logic "high" level in the power-down mode. The clock interrupt signal latch circuit 237 may deactivate the clock interrupt signal CISOB to a logic "high" level in synchronization with a point in time when the clock reset signal CRST is activated to a logic "high" level.

Figure 5:
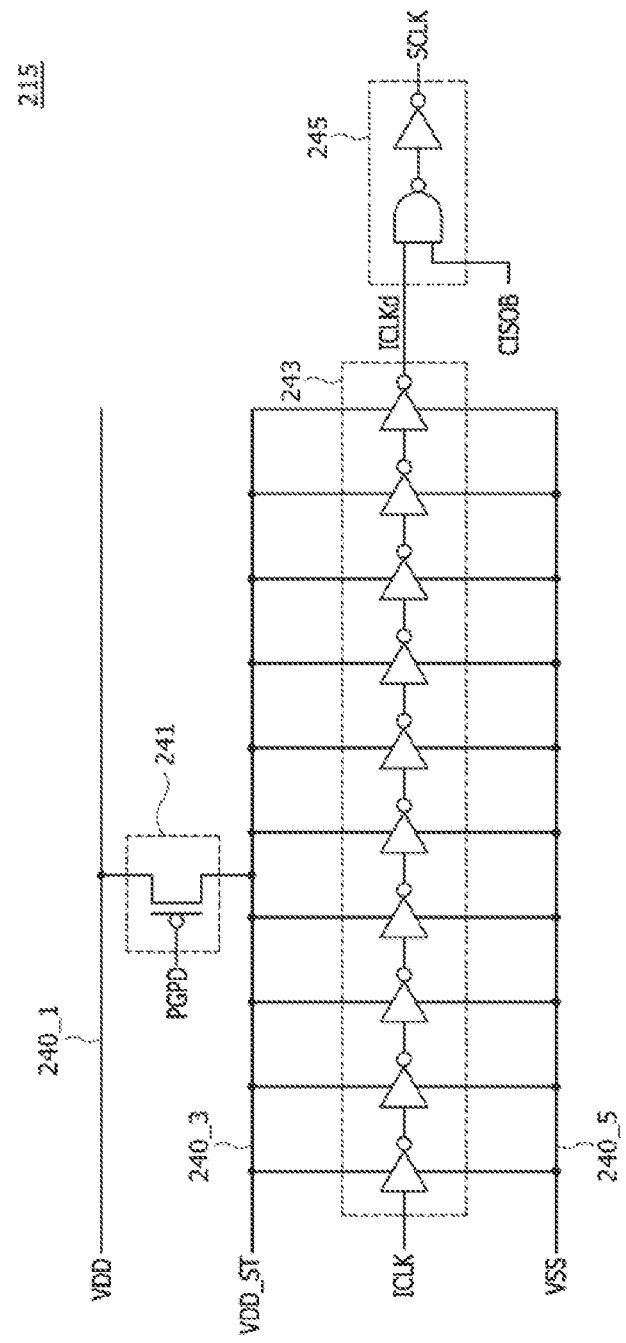
FIG. 5 is a circuit diagram illustrating a configuration of a shift clock generation circuit included in the device illustrated in FIG. 2.

Referring to FIG. 5, the shift clock generation circuit 215 may include a power gating circuit 241, a clock delay circuit 243, and a clock interrupt control circuit 245.

The power gating circuit 241 may be coupled between a power source voltage terminal 240_1 and a power gating voltage terminal 240_3. The power gating circuit 241 may generate the power gating voltage VDD_ST, which is supplied to the power gating voltage terminal 2403, from the power source voltage VDD, which is supplied to the power source voltage terminal 240_1, based on the power gating signal PGPD. The power gating circuit 241 may generate the power gating voltage VDD_ST of the power gating voltage terminal 240_3 from the power source voltage VDD supplied to the power source voltage terminal 240_1 through a PMOS transistor turned on when the power gating signal PGPD deactivated to have a logic "low" level is input to the power gating circuit 241 while the power gating operation is not performed. When the power gating operation is performed and the power gating signal PGPD is activated to a logic "high" level, the power gating circuit 241 may electrically disconnect the power source voltage terminal 240_1 from the power gating voltage terminal 240_3.

The clock delay circuit 243 may be coupled between the power gating voltage terminal 240_3 and a ground voltage terminal 240_5. The clock delay circuit 243 may receive the power gating voltage VDD_ST through the power gating voltage terminal 240_3 while the power gating operation is not performed and may receive the ground voltage VSS through the ground voltage terminal 240_5. The clock delay circuit 243 may generate a delayed internal clock signal ICLKd by delaying the internal clock signal ICLK when the power gating voltage VDD_ST and the ground voltage VSS are supplied to the clock delay circuit 243. While the power gating operation is performed, the clock delay circuit 243 may stop an operation of generating the delayed internal clock signal ICLKd because the power gating voltage VDD_ST through the power gating voltage terminal 240_3 is not supplied to the clock delay circuit 243.

The clock interrupt control circuit 245 may receive the delayed internal clock signal ICLKd from the clock delay circuit 243 and may receive the clock interrupt signal CISOB from the clock interrupt signal generation circuit 211. The clock interrupt control circuit 245 may generate the shift clock signal SCLK based on the delayed internal clock signal ICLKd and the clock interrupt signal CISOB. The clock interrupt control circuit 245 may receive the delayed internal clock signal ICLKd and the clock interrupt signal CISOB and may perform a logical AND operation of the delayed internal clock signal ICLKd and the clock interrupt signal CISOB to generate the shift clock signal SCLK. When the clock interrupt signal CISOB deactivated to a logic "high" level is input to the clock interrupt control circuit 245 for non-execution of the clock interrupt operation, the clock interrupt control circuit 245 may buffer the delayed internal clock signal ICLKd to generate the shift clock signal SCLK. When the clock interrupt signal CISOB activated to a logic "low" level is input to the clock interrupt control circuit 245 for execution of the clock interrupt operation, the clock interrupt control circuit 245 may stop an operation of generating the shift clock signal SCLK from the delayed internal clock signal ICLKd and may output a signal having a logic "low" level as the shift clock signal SCLK.

Figure 6:
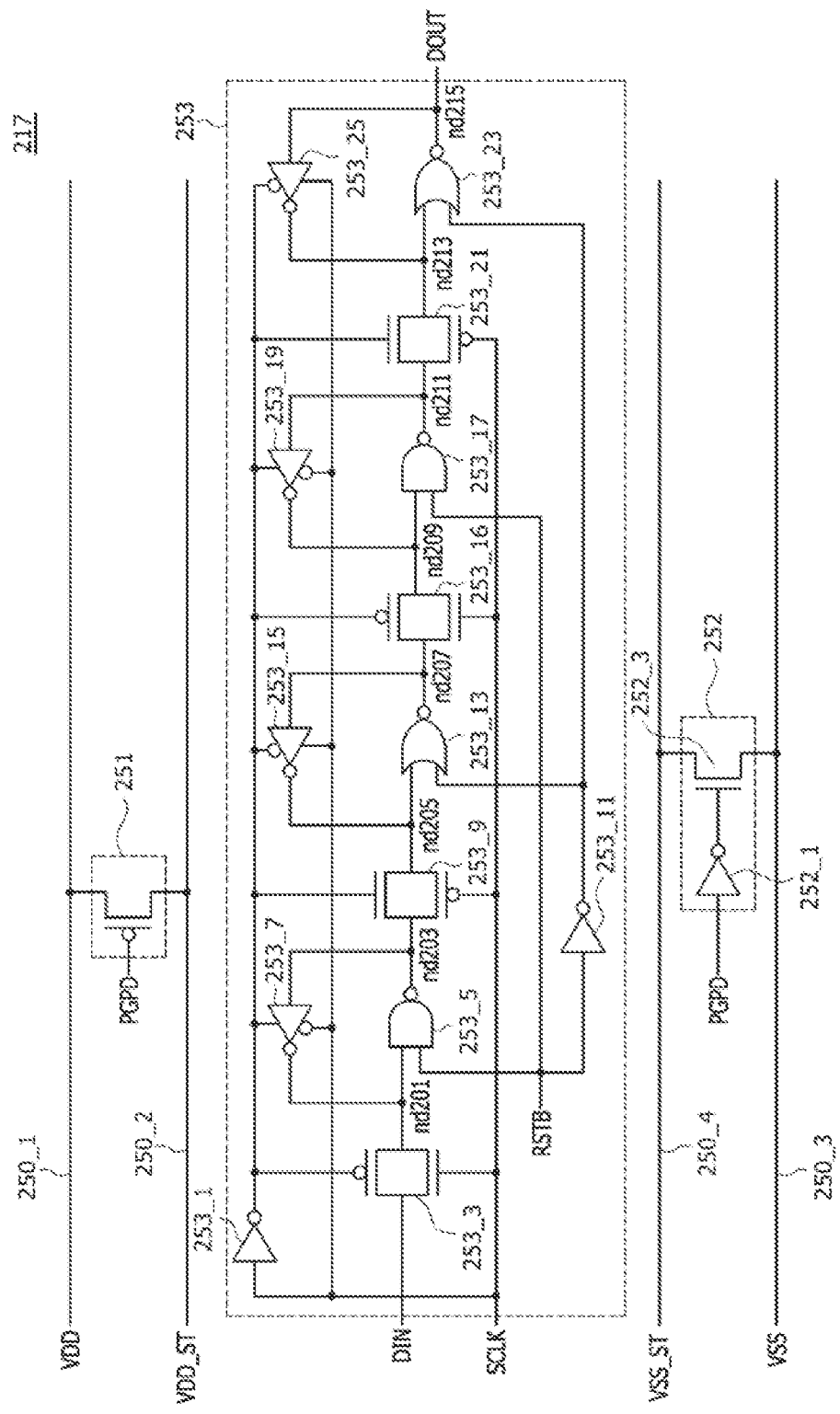
FIG. 6 is a circuit diagram illustrating a configuration of an internal circuit included in the device illustrated in FIG. 2.

Referring to FIG. 6, the internal circuit 217 may include a first power gating circuit 251, a second power gating circuit 252, and a shifting circuit 253.

The first power gating circuit 251 may be coupled between a power source voltage terminal 250_1 and a first power gating voltage terminal 250_2. The first power gating circuit 251 may generate the first power gating voltage VDD_ST of the first power gating voltage terminal 250_2 from the power source voltage VDD supplied to the power source voltage terminal 250_1 based on the power gating signal PGPD. The first power gating circuit 251 may generate the first power gating voltage VDD_ST of the first power gating voltage terminal 250_2 from the power source voltage VDD supplied to the power source voltage terminal 250_1 through a PMOS transistor turned on when the power gating signal PGPD deactivated to a logic "low" level is input to a gate of the PMOS transistor while the power gating operation is not performed. When the power gating operation is performed and the power gating signal PGPD activated to a logic "high" level is input to the first power gating circuit 251, the first power gating circuit 251 may electrically disconnect the power source voltage terminal 250_1 from the first power gating voltage terminal 250_2.

The second power gating circuit 252 may be coupled between a ground voltage terminal 250_3 and a second power gating voltage terminal 250_4. The second power gating circuit 252 may generate the second power gating voltage VSS_ST of the second power gating voltage terminal 250_4 from the ground voltage VSS supplied to the ground voltage terminal 250_3 based on the power gating signal PGPD. The second power gating circuit 252 may include an inverter 252_1 and an NMOS transistor 252_3. The second power gating circuit 252 may generate the second power gating voltage VSS_ST of the second power gating voltage terminal 250_4 from the ground voltage VSS supplied to the ground voltage terminal 250_3 through an NMOS transistor 252_3 which is turned on when the power gating signal PGPD deactivated to a logic "low" level is input to the second power gating circuit 252 while the power gating operation is not performed. When the power gating signal PGPD activated to a logic "high" level is input to the second power gating circuit 252 for execution of the power gating operation, the second power gating circuit 252 may electrically disconnect the ground voltage terminal 2503 from the second power gating voltage terminal 250_4.

The shifting circuit 253 may be coupled between the power source voltage terminal 250_1, the first power gating voltage terminal 250_2, the ground voltage terminal 250_3, and the second power gating voltage terminal 250_4. The shifting circuit 253 may receive the power source voltage VDD through the power source voltage terminal 250_1 and may receive the first power gating voltage VDD_ST through the first power gating voltage terminal 250_2, while the power gating operation is not performed. Further, the shifting circuit 253 may receive the ground voltage VSS through the ground voltage terminal 250_3 and may receive the second power gating voltage VSS_ST through the second power gating voltage terminal 250_4, while the power gating operation is not performed. The shifting circuit 253 may generate the output signal DOUT by shifting the input signal DIN when the power source voltage VDD, the first power gating voltage VDD_ST, the ground voltage VSS, and the second power gating voltage VSS_ST are supplied to the shifting circuit 253.

The shifting circuit 253 may include transfer gates 253_3, 253_9, 253_16, and 253_21, inverters 253_1, 253_7, 25311, 25315, 253_19, and 25325, NAND gates 253_5 and 253_17, and NOR gates 253_13 and 253_23. The inverter 253_1 may inversely buffer the shift clock signal SCLK to output the inversely buffered signal of the shift clock signal SCLK. The transfer gate 253_3 may output the input signal DIN to a node nd201 when the shift clock signal SCLK has a logic "high" level. The NAND gate 2535 may receive a signal of the node nd201 and a reset signal RSTB to perform a logical NAND operation of the signal of the node nd201 and the reset signal RSTB. The reset signal RSTB may be activated to have a logic "low" level for an initialization operation of the device 120. The NAND gate 253_5 may initialize a node nd203 to a logic "high" level when the reset signal RSTB is activated to have a logic "low" level, and may inversely buffer a signal of the node nd201 to output the inversely buffered signal to the node nd203 when the reset signal RSTB is deactivated to have a logic "high" level. The inverter 253_7 may inversely buffer a signal of the node nd203 to output the inversely buffered signal of the signal of the node nd203 to the node nd201 when the shift clock signal SCLK has a logic "low" level. The transfer gate 253_9 may output a signal of the node nd203 to a node nd205 when the shift clock signal SCLK has a logic "low" level. The inverter 253_11 may inversely buffer the reset signal RSTB to output the inversely buffered signal of the reset signal RSTB. The NOR gate 253_13 may receive a signal of the node nd205 and an output signal of the inverter 253_11 to perform a logical NOR operation of the signal of the node nd205 and an output signal of the inverter 253_11. The NOR gate 253_13 may initialize a node nd207 to a logic "low" level when the reset signal RSTB is activated to have a logic "low" level and may inversely buffer the signal of the node nd205 to output the inversely buffered signal of the signal of the node nd205 to the node nd207 when the reset signal RSTB is deactivated to have a logic "high" level. The inverter 253_15 may inversely buffer a signal of the node nd207 to output the inversely buffered signal of the signal of the node nd207 to the node nd205 when the shift clock signal SCLK has a logic "high" level. The transfer gate 253_16 may output a signal of the node nd207 to a node nd209 when the shift clock signal SCLK has a logic "high" level. The NAND gate 253_17 may receive a signal of the node nd209 and the reset signal RSTB to perform a logical NAND operation of the signal of the node nd209 and the reset signal RSTB. The NAND gate 25317 may initialize a node nd211 to a logic "high" level when the reset signal RSTB is activated to have a logic "low" level and may inversely buffer the signal of the node nd209 to output the inversely buffered signal of the signal of the node nd209 to the node nd211 when the reset signal RSTB is deactivated to have a logic "high" level. The inverter 253_19 may inversely buffer a signal of the node nd211 to output the inversely buffered signal of the signal of the node nd211 to the node nd209 when the shift clock signal SCLK has a logic "low" level. The transfer gate 253_21 may output the signal of the node nd211 to a node nd213 when the shift clock signal SCLK has a logic "low" level. The NOR gate 253_23 may receive a signal of the node nd213 and an output signal of the inverter 253_11 to perform a logical NOR operation. The NOR gate 25323 may initialize a node nd215 to a logic "low" level when the reset signal RSTB is activated to have a logic "low" level and may inversely buffer the signal of the node nd213 to output the inversely buffered signal to the node nd215 when the reset signal RSTB is deactivated to have a logic "high" level. The inverter 253_25 may inversely buffer a signal of the node nd215 to output the inversely buffered signal to the node nd213 when the shift clock signal SCLK has a logic "high" level.

Each of the inverters 253_1, 253_7, 253_11, 253_15, 253_19, and 253_25 included in the shifting circuit 253 may receive the power source voltage VDD through the power source voltage terminal 250_1 or the first power gating voltage VDD_ST through the first power gating voltage terminal 250_2 to set a logic level of a signal outputted therefrom based on a signal input thereto while the power gating operation is performed. In addition, each of the inverters 253_1, 253_7, 253_11, 253_15, 253_19, and 253_25 included in the shifting circuit 253 may receive the ground voltage VSS through the ground voltage terminal 250_3 or the second power gating voltage VSS_ST through the second power gating voltage terminal 2504 to set a logic level of a signal outputted therefrom based on a signal input thereto while the power gating operation is performed. Configurations and operations of the inverters 253_1, 253_7, 25311, 25315, 253_19, and 253_25 included in the shifting circuit 253 will be described with reference to FIGS. 7 and 8.

Each of the NAND gates 253_5 and 253_17 included in the shifting circuit 253 may receive the power source voltage VDD through the power source voltage terminal 250_1 or the first power gating voltage VDD_ST through the first power gating voltage terminal 250_2 to set a logic level of a signal outputted therefrom based on a signal input thereto while the power gating operation is performed. In addition, each of the NAND gates 253_5 and 253_17 included in the shifting circuit 253 may receive the ground voltage VSS through the ground voltage terminal 250_3 or the second power gating voltage VSS_ST through the second power gating voltage terminal 250_4 to set a logic level of a signal outputted therefrom based on a signal input thereto while the power gating operation is performed. Configurations and operations of the NAND gates 253_5 and 253_17 included in the shifting circuit 253 will be described with reference to FIGS. 9 and 10.

Each of the NOR gates 253_13 and 253_23 included in the shifting circuit 253 may receive the power source voltage VDD through the power source voltage terminal 250_1 or the first power gating voltage VDD_ST through the first power gating voltage terminal 2502 to set a logic level of a signal outputted therefrom based on a signal input thereto while the power gating operation is performed. In addition, each of the NOR gates 253_13 and 253_23 included in the shifting circuit 253 may receive the ground voltage VSS through the ground voltage terminal 250_3 or the second power gating voltage VSS_ST through the second power gating voltage terminal 250_4 to set a logic level of a signal outputted therefrom based on a signal input thereto while the power gating operation is performed. Configurations and operations of the NOR gates 253_13 and 253_23 included in the shifting circuit 253 will be described with reference to FIGS. 11 and 12.

Figure 7:
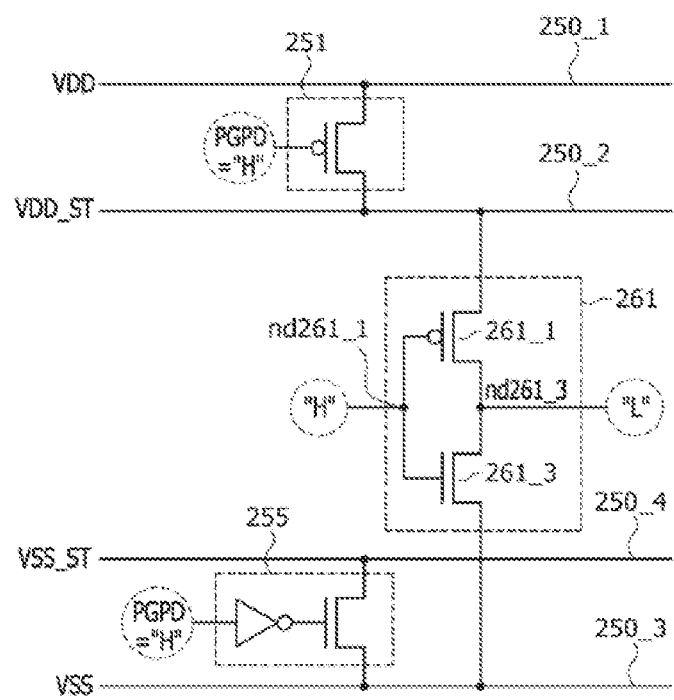
FIG. 7 is a circuit diagram illustrating an example of an inverter included in the internal circuit illustrated in FIG. 6.

Referring to FIG. 7, an example of each of the inverters 2531, 253_7, 25311, 25315, 25319, and 253_25 included in the shifting circuit 253 is illustrated. Each of the inverters 253_1, 253_7, 25311, 253_15, 253_19, and 253_25 included in the shifting circuit 253 may be realized using an inverter 261. The inverter 261 may include a PMOS transistor 261_1 and an NMOS transistor 261_3 which are coupled in series. When the power gating signal PGPD is activated to have a logic "high" level for execution of the power gating operation, the power source voltage terminal 250_1 and the first power gating voltage terminal 250_2 may be electrically disconnected from each other and the ground voltage terminal 2503 and the second power gating voltage terminals 250_4 may be electrically disconnected from each other. When a signal having a logic "high(H)" level is input to an input node nd261_1 of the inverter 261 during the power gating operation, the NMOS transistor 2613 may be connected to the ground voltage terminal 250_3 to receive the ground voltage VSS. As a result, an output node 261_3 of the inverter 261 may be set to have a logic "low(L)" level.

Figure 8:
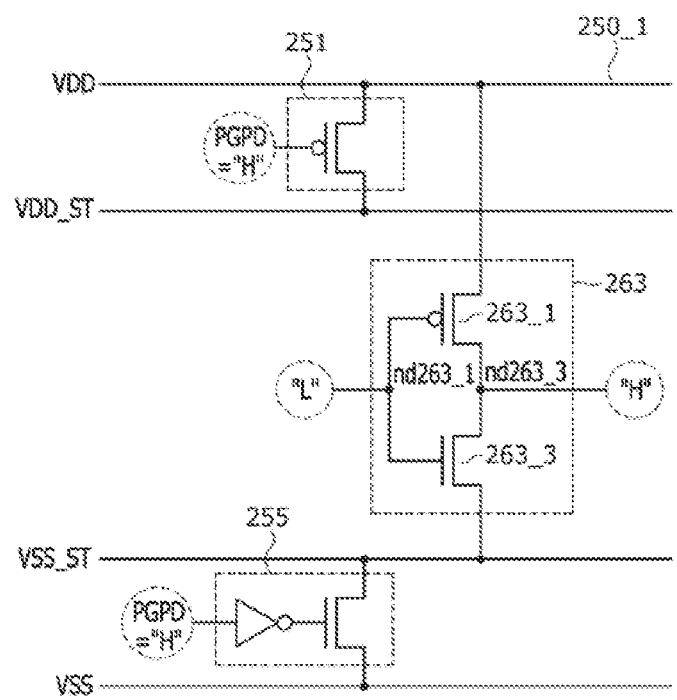
FIG. 8 is a circuit diagram illustrating another example of an inverter included in the internal circuit illustrated in FIG. 6.

Referring to FIG. 8, another example of each of the inverters 253_1, 253_7, 253_11, 253_15, 253_19, and 253_25 included in the shifting circuit 253 is illustrated. Each of the inverters 253_1, 253_7, 253_11, 253_15, 253_19, and 253_25 included in the shifting circuit 253 may be realized using an inverter 263. The inverter 263 may include a PMOS transistor 263_1 and an NMOS transistor 263_3 which are coupled in series. When a signal having a logic "low(L)" level is input to an input node nd263_1 of the inverter 263 during the power gating operation, the PMOS transistor 2631 may be connected to the power source voltage terminal 250_1 to receive the power source voltage VDD. As a result, an output node 263_3 of the inverter 263 may be set to have a logic "high(H)" level.

Figure 9:
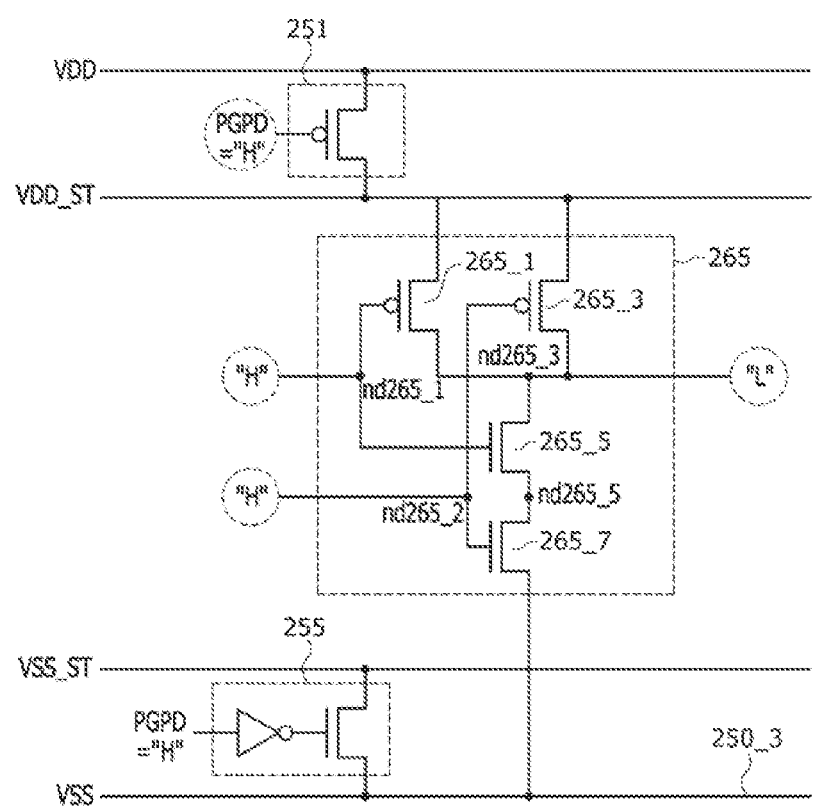
FIG. 9 is a circuit diagram illustrating an example of a NAND gate included in the internal circuit illustrated in FIG. 6.

Referring to FIG. 9, an example of each of the NAND gates 253_5 and 253_17 included in the shifting circuit 253 is illustrated. Each of the NAND gates 253_5 and 253_17 included in the shifting circuit 253 may be realized using a NAND gate 265. The NAND gate 265 may include PMOS transistors 265_1 and 265_3 and NMOS transistors 265_5 and 265_7. When a signal of a logic "high(H)" level is input to input nodes nd265_1 and nd265_2 of the NAND gate 265 during the power gating operation, the NMOS transistor 265_7 may be coupled between a node nd265_5 and the ground voltage terminal 2503 to receive the ground voltage VSS. As a result, an output node nd265_3 of the NAND gate 265 may be set to have a logic "low(L)" level.

Figure 10:
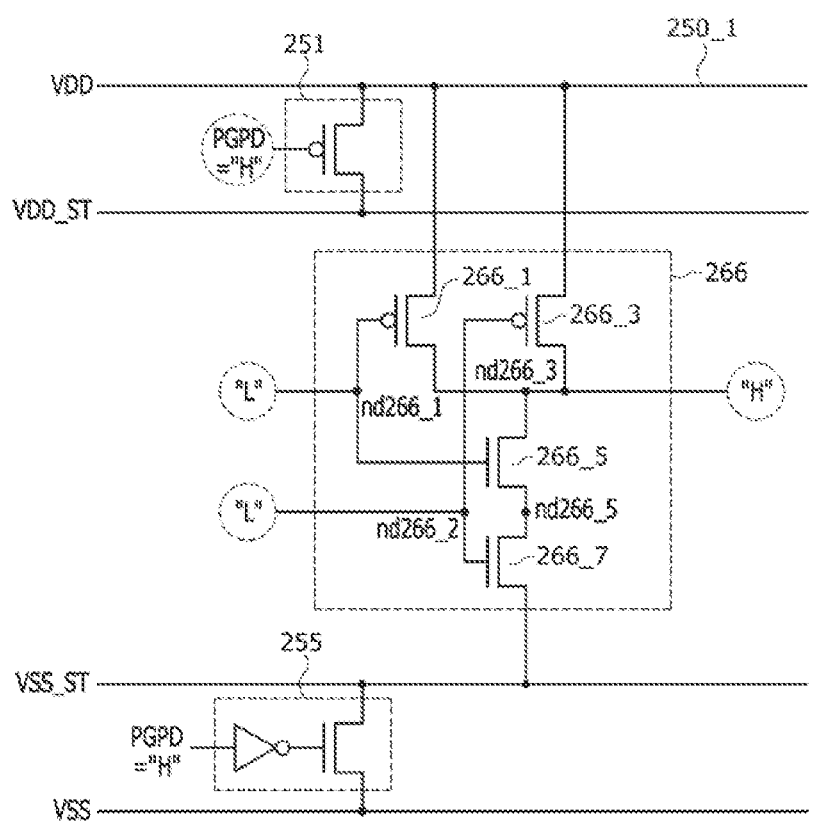
FIG. 10 is a circuit diagram illustrating another example of a NAND gate included in the internal circuit illustrated in FIG. 6.

Referring to FIG. 10, another example of each of the NAND gates 253_5 and 253_17 included in the shifting circuit 253 is illustrated. Each of the NAND gates 253_5 and 253_17 included in the shifting circuit 253 may be realized using a NAND gate 266. The NAND gate 266 may include PMOS transistors 266_1 and 266_3 and NMOS transistors 266_5 and 266_7. When a signal of a logic "low(L)" level is input to input nodes nd266_1 and nd266_2 of the NAND gate 266 during the power gating operation, the PMOS transistors 266_1 and 266_3 may be coupled in parallel between the power source voltage terminal 250_1 and an output node nd266_3 to receive the power source voltage VDD. As a result, the output node nd266_3 of the NAND gate 266 may be set to have a logic "high(H)" level.

Figure 11:
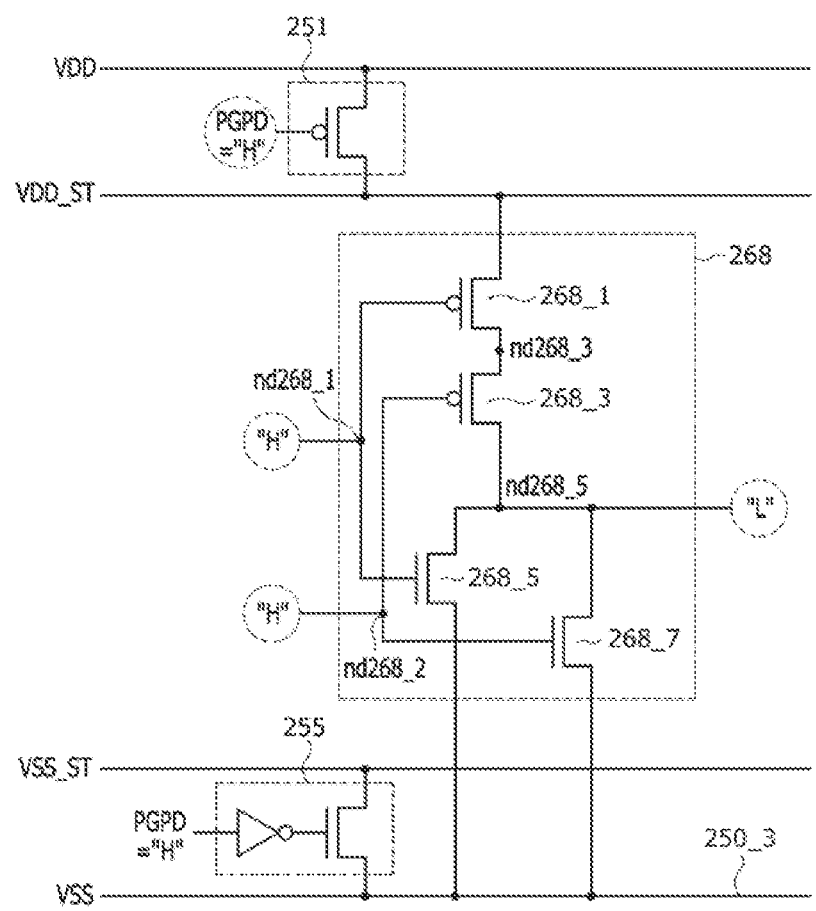
FIG. 11 is a circuit diagram illustrating an example of a NOR gate included in the internal circuit illustrated in FIG. 6.

Referring to FIG. 11, an example of each of the NOR gates 253_13 and 253_23 included in the shifting circuit 253 is illustrated. Each of the NOR gates 25313 and 25323 included in the shifting circuit 253 may be realized using a NOR gate 268. The NOR gate 268 may include PMOS transistors 268_1 and 2683 and NMOS transistors 268_5 and 268_7. When a signal of a logic "high(H)" level is input to input nodes nd268_1 and nd268_2 of the NOR gate 268 during the power gating operation, the NMOS transistors 268_5 and 2687 may be coupled in parallel between an output node nd268_5 and the ground voltage terminal 250_3 to receive the ground voltage VSS. As a result, the output node nd268_3 of the NOR gate 268 may be set to have a logic "low(L)" level.

Figure 12:
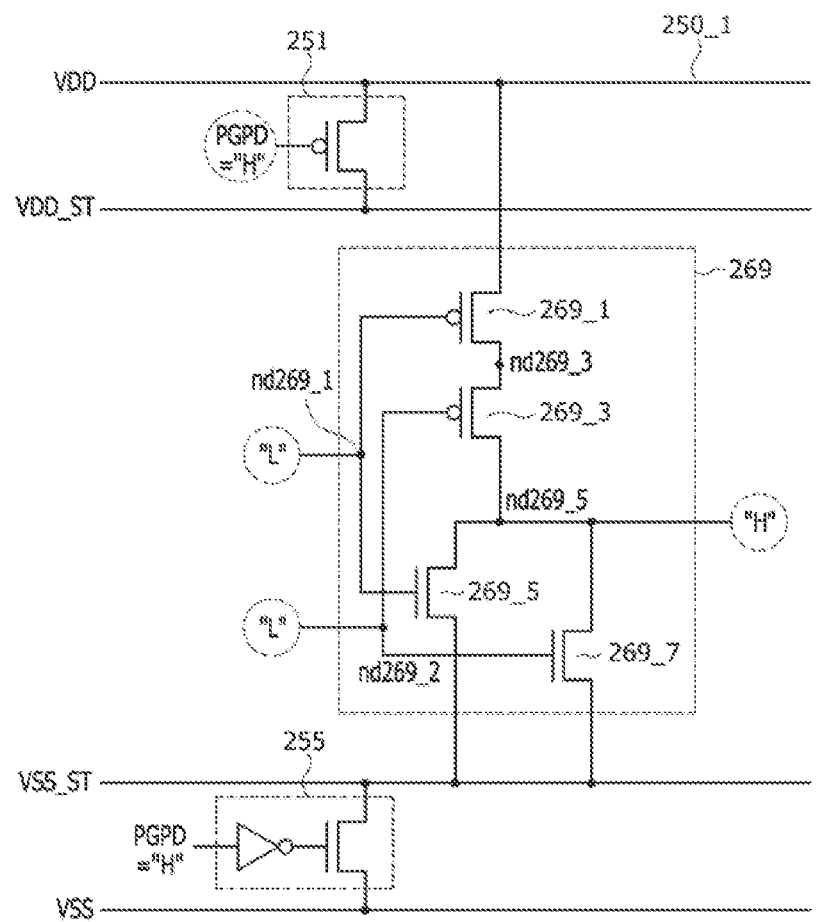
FIG. 12 is a circuit diagram illustrating another example of a NOR gate included in the internal circuit illustrated in FIG. 6.

Referring to FIG. 12, another example of each of the NOR gates 253_13 and 253_23 included in the shifting circuit 253 is illustrated. Each of the NOR gates 253_13 and 253_23 included in the shifting circuit 253 may be realized using a NOR gate 269. The NOR gate 269 may include PMOS transistors 269_1 and 269_3 and NMOS transistors 269_5 and 269_7. When a signal of a logic "low(L)" level is input to input nodes nd269_1 and nd269_2 of the NOR gate 269 during the power gating operation, the PMOS transistor 269_1 may be coupled between a node nd269_3 and the power source voltage terminal 250_1 to receive the power source voltage VDD. As a result, an output node nd269_S of the NOR gate 269 may be set to have a logic "high(H)" level.

The power gating operation and the clock interrupt operation of the device 120 having an aforementioned configuration will be described hereinafter with reference to FIGS. 13 to 19.

Figure 13:
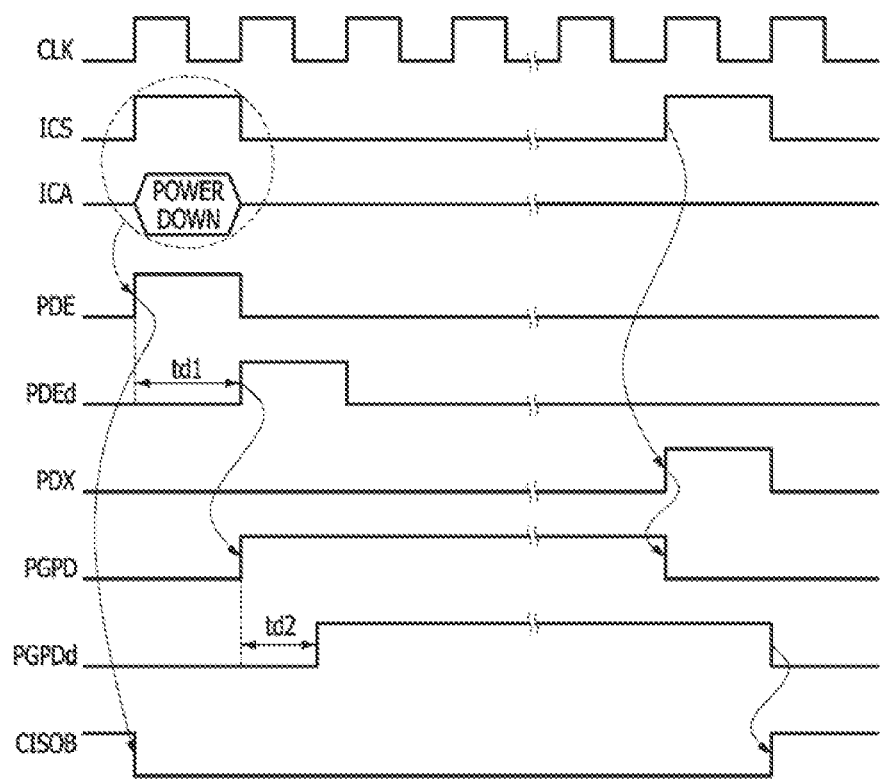
FIGS. 13, 14, 15, 16, 17, 18, and 19 illustrate operations of the device illustrated in FIGS. 1 to 6.

First, as illustrated in FIG. 13, in order to enter execute the power-down mode, the mode entry signal PDE activated to have a logic "high" level may be generated when the internal chip selection signal ICS is activated to have a logic "high" level and the internal set signal ICA is generated to have a predetermined logic level combination (POWER DOWN).

Figure 14:
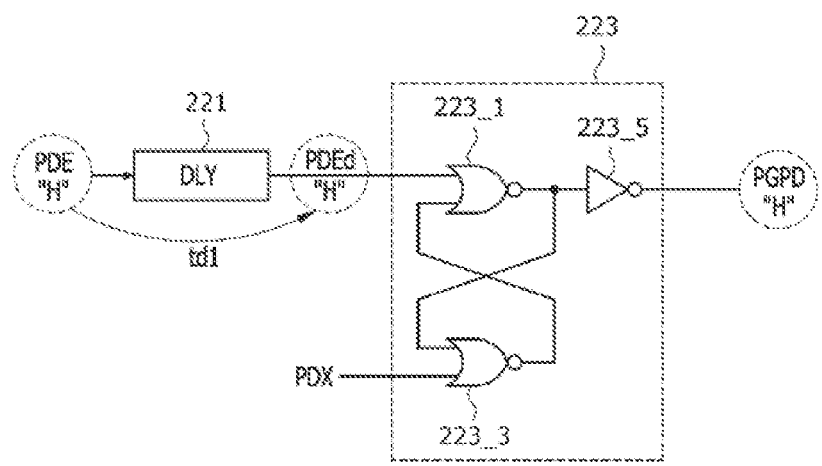

Next, as illustrated in FIGS. 13 and 14, the power gating signal PGPD may be activated to have a logic "high(H)" level by the delayed mode entry signal PDEd which is generated by delaying the mode entry signal PDE by a first delay period "td1". That is, in order to perform the power gating operation, the power gating signal PGPD may be activated to have a logic "high(H)" level by the delayed mode entry signal PDEd which is generated to have a logic "high(H)" level at a point in time when the first delay period td1 elapses from a point in time when the mode entry signal PDE is activated to have a logic "high(H)" level.

Figure 15:
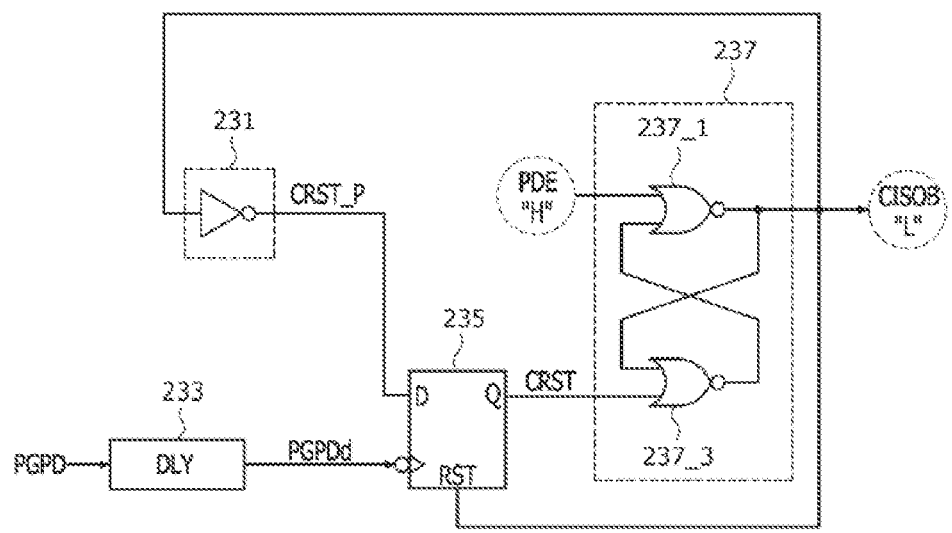

Meanwhile, as illustrated in FIGS. 13 and 15, when the mode entry signal PDE is activated to have a logic "high(H)" level, the clock interrupt signal CISOB may be activated to have a logic "low(L)" level. That is, when the mode entry signal PDE is activated to have a logic "high(H)" level for execution of the power-down mode, the clock interrupt signal CISOB may be activated to have a logic "low(L)" level for the clock interrupt operation.

Figure 16:
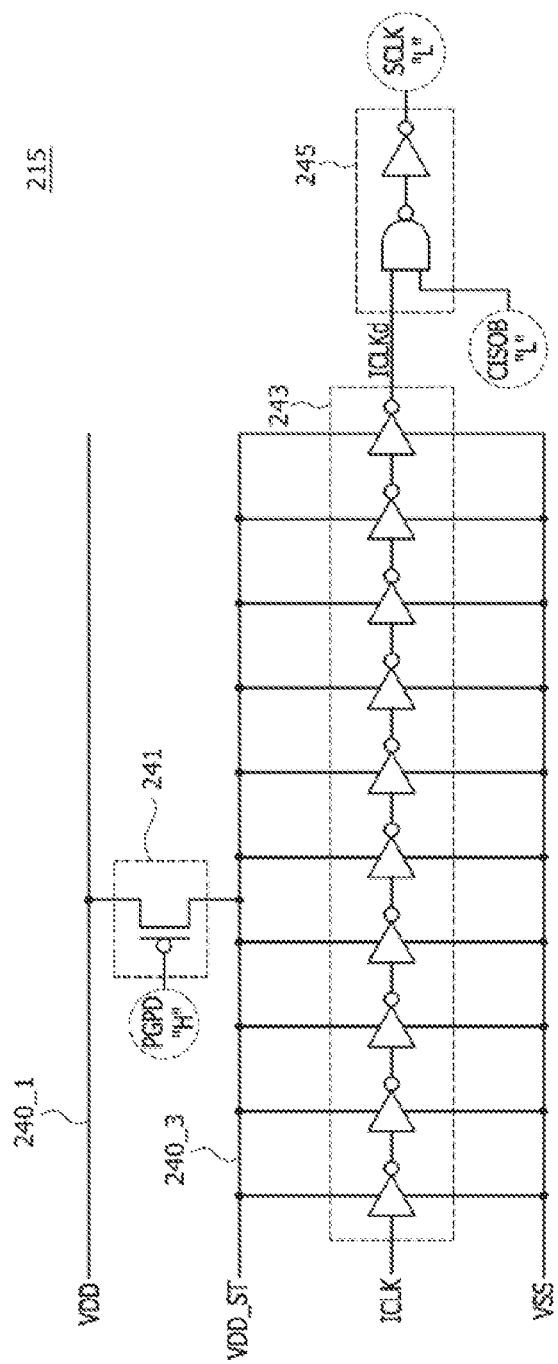

Next, as illustrated in FIGS. 13 and 16, while the power gating operation is performed, the power source voltage terminal 240_1 and the power gating voltage terminals 240_3 may be electrically disconnected from each other by the power gating signal PGPD which is activated to have a logic "high(H)" level. Accordingly, because the power gating voltage VDD_ST cannot be supplied to the clock delay circuit 243, the clock delay circuit 243 may stop generation of the delayed internal clock signal ICLKd. In addition, while the clock interrupt operation is performed, an operation of generating the shift clock signal SCLK may be interrupted by the clock interrupt signal CISOB which is activated to have a logic "low(L)" level. As a result, the shift clock signal SCLK may be set to have a logic "low(L)" level.

Next, as illustrated in FIG. 13, when the internal chip selection signal ICS activated to have a logic "high" level is generated in the power-down mode, the mode exit signal PDX activated to have a logic "high" level may be generated to exit the power-down mode.

Figure 17:
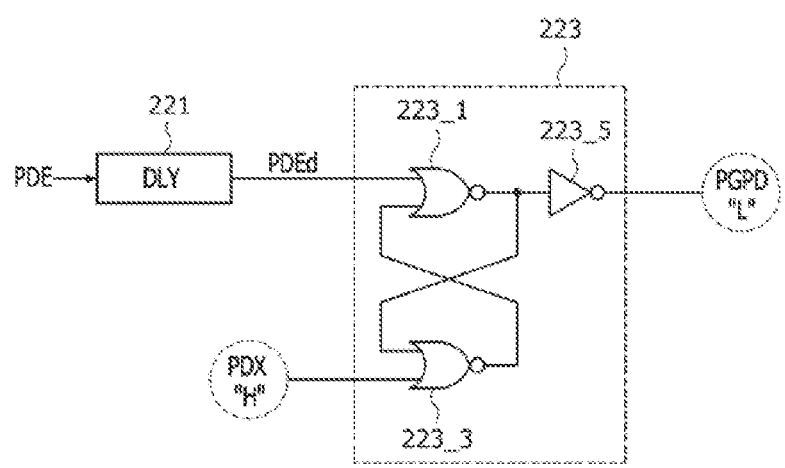

Next, as illustrated in FIGS. 13 and 17, when the mode exit signal PDX activated to have a logic "high(H)" level is generated, the power gating signal PGPD may be deactivated to have a logic "low(L)" level. That is, when the mode exit signal PDX is activated to have a logic "high(H)" level to exit the power-down mode, the power gating signal PGPD may be deactivated to have a logic "low(L)" level to terminate the power gating operation.

Figure 18:
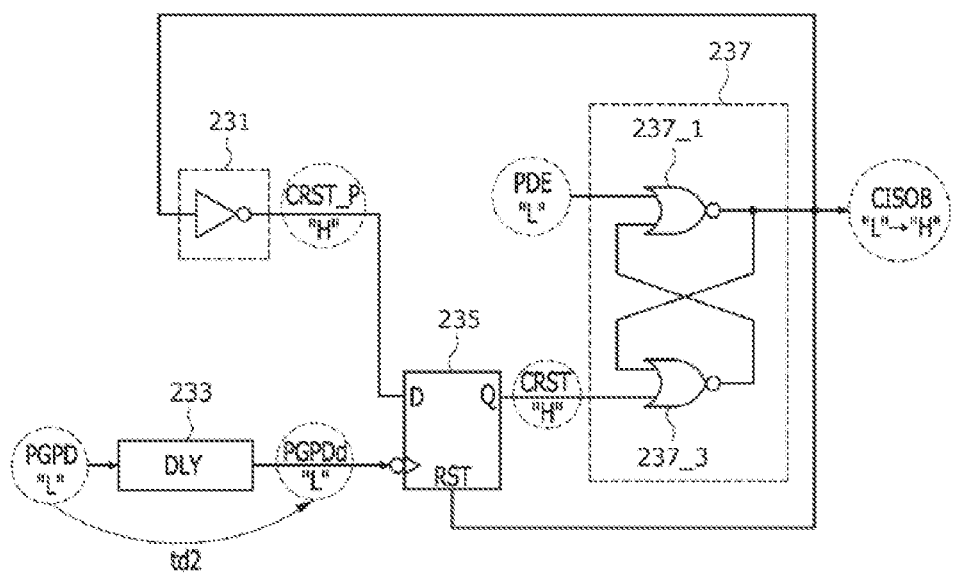

Next, as illustrated in FIGS. 13 and 18, the delayed power gating signal PGPDd may be generated to have a logic "low(L)" level at a point in time when a second delay period "td2" elapses from a point in time when the power gating operation terminates. This is because the delayed power gating signal PGPDd is a signal which is generated by delaying the power gating signal PGPD by the second delay period "td2". The pre-clock reset signal CRST_P having a logic "high(H)" level may be latched at a point in time when the delayed power gating signal PGPDd is set to have a logic "low(L)" level and the latched signal of the pre-clock reset signal CRST_P may be outputted as the clock reset signal CRST. As a result, a level of the clock interrupt signal CISOB may change from a logic "low(L)" level into a logic "high(H)" level by the mode entry signal PDE having a logic "low(L)" level and the clock reset signal CRST having a logic "high(H)" level. That is, the clock interrupt signal CISOB may be deactivated to have a logic "high(H)" level at a point in time when the second delay period "td2" elapses from a point in time when the power gating operation terminates, thereby terminating the clock interrupt operation.

Figure 19:
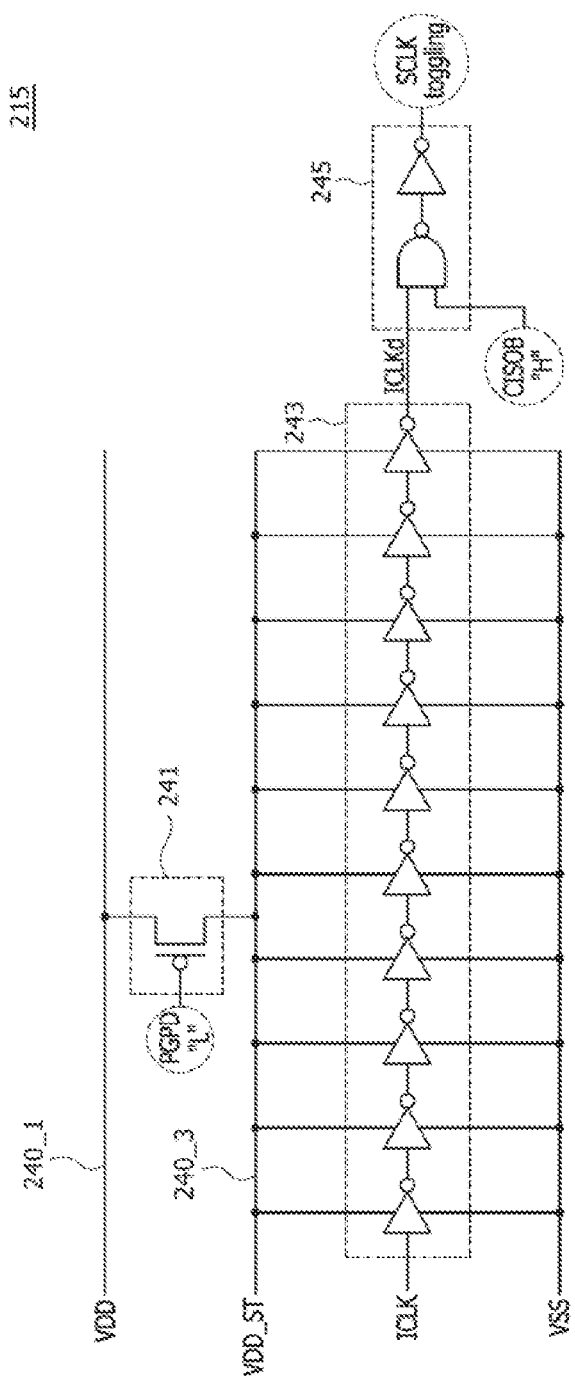

Finally, as illustrated in FIGS. 13 and 19, after the power gating operation terminates, the power gating voltage VDD_ST of the power gating voltage terminal 240_3, which is generated from the power source voltage VDD (supplied through the power source voltage terminal 2401) by the power gating signal PGPD deactivated to have a logic "low(L)" level, may be supplied to the clock delay circuit 243. In addition, after the clock interrupt operation terminates, the shift clock signal SCLK generated from the delayed internal clock signal ICLKd generated by the clock delay circuit 243 based on the clock interrupt signal CISOB deactivated to have a logic "high(H)" level may be toggled.

The concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the concepts is not limited to the above descriptions but defined by the accompanying claims, and all of distinctive features in the equivalent scope should be construed as being included in the concepts.

What is claimed is:

1. A device comprising:
   a power gating signal generation circuit configured to generate a power gating signal based on a mode entry signal and a mode exit signal to perform a power gating operation;
   a clock interrupt signal generation circuit configured to generate a clock interrupt signal based on the mode entry signal and the power gating signal to perform a clock interrupt operation; and
   a shift clock generation circuit configured to generate a shift clock signal supplied to an internal circuit based on the power gating signal and the clock interrupt signal.

2. The device of claim 1, further comprising:
   a command decoder configured to generate the mode entry signal based on an internal set signal and an internal chip selection signal to enter a power-down mode.

3. The device of claim 1, further comprising:
   a mode exit signal generation circuit configured to generate the mode exit signal based on an internal chip selection signal and the mode entry signal to exit a power-down mode.

4. The device of claim 1, wherein the power gating signal generation circuit generates the power gating signal activated to perform the power gating operation based on a point in time when the mode entry signal is activated and generates the power gating signal deactivated to terminate the power gating operation based on a point in time when the mode exit signal is activated.

5. The device of claim 4, wherein the power gating signal generation circuit includes:
   a mode delay circuit configured to generate a delayed mode entry signal by delaying the mode entry signal; and
   a power gating signal latch circuit configured to latch the power gating signal based on the delayed mode entry signal and the mode exit signal.

6. The device of claim 1, wherein the clock interrupt signal generation circuit generates the clock interrupt signal activated to perform the clock interrupt operation based on a point in time when the mode entry signal is activated and generates the clock interrupt signal deactivated to terminate the clock interrupt operation based on a point in time when the power gating signal is deactivated.

7. The device of claim 6, wherein the clock interrupt signal generation circuit includes:
   a clock reset signal generation circuit configured to latch a pre-clock reset signal generated based on the clock interrupt signal in synchronization with a delayed power gating signal generated by delaying the power gating signal and configured to output the latched pre-clock reset signal as a clock reset signal; and
   a clock interrupt signal latch circuit configured to latch the clock interrupt signal based on the mode entry signal and the clock reset signal.

8. The device of claim 1, wherein the clock interrupt signal generation circuit generates the clock interrupt signal that is activated during a period which is set to be greater than a period during which the power gating signal is activated.

9. The device of claim 1, wherein the shift clock generation circuit stops generating the shift clock signal by interrupting supply of a power gating voltage, which is generated from a power source voltage, when the power gating operation is performed.

10. The device of claim 1, wherein the shift clock generation circuit stops generating the shift clock signal when the clock interrupt operation is performed.

11. The device of claim 1, wherein the internal circuit generates an output signal by shifting an input signal based on the shift clock signal while the internal circuit is out of a power-down mode.

12. The device of claim 1, wherein the internal circuit includes a MOS transistor configured to selectively receive one of a power source voltage and a power gating voltage generated from the power source voltage when the power gating operation is performed.

13. The device of claim 1, wherein the internal circuit includes a MOS transistor configured to selectively receive one of a ground voltage and a power gating voltage generated from the ground voltage when the power gating operation is performed.

14. A device comprising:
   a power gating signal generation circuit configured to generate a power gating signal activated to perform a power gating operation based on a point in time when a mode entry signal is activated and configured to generate the power gating signal deactivated to terminate the power gating operation based on a point in time when a mode exit signal is activated;
   a clock interrupt signal generation circuit configured to generate a clock interrupt signal that is activated for execution of a clock interrupt operation during a period which is set to be greater than a period during which the power gating signal is activated; and
   a shift clock generation circuit configured to generate a shift clock signal supplied to an internal circuit based on the power gating signal and the clock interrupt signal.

15. The device of claim 14, wherein the power gating signal generation circuit includes:
   a mode delay circuit configured to generate a delayed mode entry signal by delaying the mode entry signal; and
   a power gating signal latch circuit configured to latch the power gating signal based on the delayed mode entry signal and the mode exit signal.

16. The device of claim 14, wherein the clock interrupt signal generation circuit generates the clock interrupt signal activated to perform the clock interrupt operation based on a point in time when the mode entry signal is activated and generates the clock interrupt signal deactivated to terminate the clock interrupt operation based on a point in time when the power gating signal is deactivated.

17. The device of claim 16, wherein the clock interrupt signal generation circuit includes:
   a clock reset signal generation circuit configured to latch a pre-clock reset signal generated based on the clock interrupt signal in synchronization with a delayed power gating signal generated by delaying the power gating signal and configured to output the latched pre-clock reset signal as a clock reset signal; and
   a clock interrupt signal latch circuit configured to latch the clock interrupt signal based on the mode entry signal and the clock reset signal.

18. The device of claim 14, wherein the shift clock generation circuit stops generating the shift clock signal by interrupting supply of a power gating voltage, which is generated from a power source voltage, when the power gating operation is performed.

19. The device of claim 14, wherein the shift clock generation circuit stops generating the shift clock signal when the clock interrupt operation is performed.

20. The device of claim 14, wherein the internal circuit generates an output signal by shifting an input signal based on the shift clock signal while the internal circuit is out of a power-down mode.

21. The device of claim 14, wherein the internal circuit includes a MOS transistor configured to selectively receive a power source voltage or a power gating voltage generated from the power source voltage when the power gating operation is performed.

22. The device of claim 14, wherein the internal circuit includes a MOS transistor configured to selectively receive one of a ground voltage and a power gating voltage generated from the ground voltage when the power gating operation is performed.

23. A device comprising:
a power gating signal generation circuit configured to generate a power gating signal to perform a power gating operation;
a clock interrupt signal generation circuit configured to generate a clock interrupt signal that is activated for execution of a clock interrupt operation during a period which is set to be greater than a period during which the power gating signal is activated;
a shift clock generation circuit configured to stop generating a shift clock signal by interrupting supply of a power gating voltage, which is generated from a power source voltage, when the power gating operation is performed and configured to stop generating the shift clock signal when the clock interrupt operation is performed; and
an internal circuit configured to generate an output signal by shifting an input signal based on the shift clock signal while the internal circuit is out of a power-down mode.

24. The device of claim 23, wherein the power gating signal generation circuit generates the power gating signal activated to perform the power gating operation based on a point in time when a mode entry signal is activated and generates the power gating signal deactivated to terminate the power gating operation based on a point in time when a mode exit signal is activated.

25. The device of claim 23, wherein the clock interrupt signal generation circuit generates the clock interrupt signal activated to perform the clock interrupt operation based on a point in time when a mode entry signal is activated and generates the clock interrupt signal deactivated to terminate the clock interrupt operation based on a point in time when the power gating signal is deactivated.

26. The device of claim 23, wherein the internal circuit includes a MOS transistor configured to selectively receive one of a power source voltage and a power gating voltage generated from the power source voltage when the power gating operation is performed.

27. The device of claim 23, wherein the internal circuit includes a MOS transistor configured to selectively receive one of a ground voltage and a power gating voltage generated from the ground voltage when the power gating operation is performed.

* * * * *